(12) United States Patent
Wirtz et al.

(10) Patent No.: US 7,417,392 B2
(45) Date of Patent: Aug. 26, 2008

(54) ELECTRONIC LINE SHAFT WITH PHASED LOCK LOOP FILTERING AND PREDICTING

(75) Inventors: Steven Michael Wirtz, West Bend, WI (US); Thomas J. Rehm, Mequon, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 153 days.

(21) Appl. No.: 11/523,308

(22) Filed: Sep. 19, 2006

(65) Prior Publication Data
US 2007/0013334 A1    Jan. 18, 2007

Related U.S. Application Data

(63) Continuation-in-part of application No. 11/141,596, filed on May 31, 2005.

(51) Int. Cl.
*H02P 7/00*    (2006.01)

(52) U.S. Cl. .................. 318/432; 318/77; 318/400.4; 318/400.3; 318/700

(58) Field of Classification Search ............... 318/432, 318/77, 400.4, 400.3, 85, 700, 705; 345/55
See application file for complete search history.

(56) References Cited

U.S. PATENT DOCUMENTS 3,636,553 A * 1/1972 Hancock ................. 345/55

* cited by examiner

*Primary Examiner*—Karen Masih
(74) *Attorney, Agent, or Firm*—Boyle Fredrickson; Alexander R. Kuszewski

(57) ABSTRACT

An improved electronic line shaft provides for a predictor sending predicted position and/or velocity values to servant drives that may be later strobed in by high speed low-latency strobe signals to eliminate network jitter and delay. The predictor may be implemented as a phase lock loop, providing filtering of a master encoder signal together with flexible electronic gear ratio adjustments and other desired control refinements.

31 Claims, 3 Drawing Sheets

ELECTRONIC LINE SHAFT WITH PHASED LOCK LOOP FILTERING AND PREDICTING

CROSS-REFERENCE TO RELATED APPLICATIONS

This application is a continuation-in-part of application Ser. No. 11/141,596 filed May 31, 2005, incorporated by reference herein.

BACKGROUND OF THE INVENTION

The present invention relates to electronic line shafts in which servo driven motors simulate a mechanically continuous shaft and, in particular, to an electronic system for improving electronic line shaft operation.

Many industrial processes require a mechanical line shaft with intermediate gear boxes or the like to maintain precise phase or position among a number of driven structures. For example, in a printing press, each color must be precisely overlaid on the previous color to hold registration and this may be done by a mechanical line shaft joining each of the print cylinders.

Over time, the mechanical line shaft may wear, causing phase shift among the drives. Mechanical shaft systems are also cumbersome and difficult to reconfigure.

For these reasons it is known to create an electronic line shaft in which a master reference is established, for example, one cylinder on a printing press, and its position and phase captured by an encoder. The encoder signals are forwarded to servomotors attached to the other print cylinders, each cylinder having a motor encoder feedback unit that matches the position of the cylinder to the master reference. Alternatively, the master reference may be a signal generator, generating a virtual encoder signal with all cylinders being locked to that signal.

While the electronic signals transmitted from the master reference or virtual master reference to each of the servant drives propagate at an extremely high rate, it is not instantaneous and thus there may be some phase lag at servant motor drives that are displaced spatially or electronically from the master reference. This problem is particularly acute for networks which provide simplicity in connecting motor drives, but which introduce additional network-type propagation delays.

Propagation delays in the transmission of the encoder signals among the various drive units may be accommodated somewhat by, for example, advancing the cylinders associated with the delayed units to offset the delay in their receipt of the signal. This approach of anticipating network delay, however, is not always successful because of a variation in the delay depending on network traffic and other factors. Further, for systems that work at different rotational speeds, advancing the cylinder positions, for example by adjusting the encoders or the like, for a given speed will produce phase errors for lower speeds where the propagation delay results in an effectively smaller phase advance.

SUMMARY OF THE INVENTION

The present invention provides an electronic line shaft system that includes a predictor that anticipates the position value of an encoder or virtual encoder at a fixed periodic time in the future. The predicted value is sent to the servant units which hold the value until the periodic interval at which time a strobe signal causes each of the servant units to accept a position value and to control its motor system accordingly.

The timing of the strobe signal is such that all network delay and jitter is resolved before the position signal is accepted. Further, because the prediction is not a phase advance, but a prediction of actual position at a time in the future, the accuracy of the prediction does not change as a function of the frequency of the drive. The predictor may be simply realized as a phase lock loop, either in discrete circuitry or as programmed into an electronic computer. The phase lock loop naturally also produce a velocity signal that may be used in the control algorithm.

Specifically then, the present invention provides an electronic line shaft system having multiple servant motor drives, receiving a position signal and a strobe signal, each connectable to corresponding motor-driven line shafts to synchronize a position of the line shafts to the position signal at the time of the strobe signal. A master controller receives a position signal from an encoder indicating the position of a master line shaft, and the network communicates between the multiple servant motor drives and the master motor drives, the network having a communication delay and a master drive with no communication delay. The invention employs a synchronizing system, including a predictor, accepting the position signal from the master controller and providing a predicted position signal to the servant motor drives together with a strobe signal, the predicted position signal representing a prediction of a future position of the motor at a predetermined time in the future, coinciding with the time of the strobe signal. The predictor system also provides output the in actual time to the master drive controller and so in total has four outputs: actual position, actual velocity, predicted position and predicted velocity.

Thus it is one object of at least one embodiment of the invention to accommodate network delay and jitter with minimal position phase error.

The predictor may be a phase locked loop including an electronically controllable oscillator implemented as a "virtual encoder" as is described in U.S. Pat. No. 6,850,021 B1, issued Feb. 1, 2005 assigned to the assignee of the present application and hereby incorporated by reference. The virtual encoder outputs a predicted position signal according to its velocity input and a phase comparator receiving the predicted position signal and the position signal to produce a phase difference signal providing the velocity input to the virtual encoder.

Thus it is another object of at least one embodiment of the invention to provide a simple implementation of a predictor in the form of a phase locked loop.

The predictor may be implemented in either analog electronic circuitry or digital electronic circuitry including a programmable electronic processor.

It is thus another object of at least one embodiment of the invention to provide a predictor that may be flexibly implemented in a variety of ways.

The position signal may be a periodic signal indicating change and direction of movement in movement increments.

Thus, it is an object of at least one embodiment of the invention to provide a system that works with incremental encoders.

The predictor may include a divider/multiplier changing the frequency of one of the position signal and predicted position signal to change the ratio between the position signal and the predicted position signal while maintaining a phase lock between the position signal and the predicted position signal.

It is thus another object of at least one embodiment of the invention to allow a simple method of creating virtual gear boxes on an electronic line shaft.

The predictor may include a frequency filter, such as a low pass filter or compensator, positioned between the phase difference signal and the velocity input to virtual encoder to provide a frequency filtering.

It is thus another object of at least one embodiment of the invention to provide a simple electronic system for smoothing velocity and position changes of the line shaft.

The synchronizing system further transmits a velocity signal to the servant motor drives by means of the predictor providing the velocity signal from the input to the virtual encoder The synchronizing system further transmits a velocity signal to the master motor drives be means of the non-predicted velocity signal from the input to the virtual encoder.

It is thus another object of at least one embodiment of the invention to provide a simple method of extracting velocity from a position signal through the use of a phase lock loop.

The system may include a time delay, shifting one of the times of the position signal and the predicted position signal to advance the phase of the predicted position signal while maintaining a phase lock between the position signal and predicted position signal.

It is thus another object of at least one embodiment of the invention to provide a simple method of predicting a position in the future through the introduction of a delay in the feedback loop of the phase lock loop.

It is thus another object of at least one embodiment of the invention to provide a delay of predicted position and velocity to create a real time position and velocity that is not advanced or predicted in time.

These particular objects and advantages may apply to only some embodiments falling within the claims and thus do not define the scope of the invention.

DETAILED DESCRIPTION OF THE PREFERRED EMBODIMENT

Figure 1:
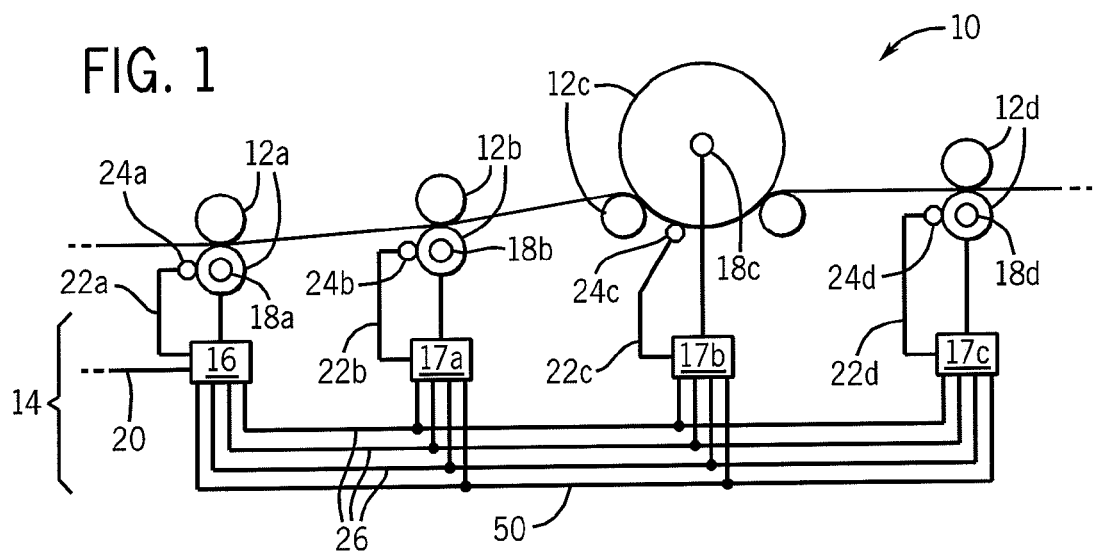
FIG. 1 is a schematic representation of an electronic line shaft used, for example, in a printing line in which a master controller monitors the position of a first printing cylinder to produce control signals for a set of servant controllers controlling positions of later printing cylinders.

Referring now to FIG. 1, a printing press 10 may employ a number of printing cylinder pairs 12a-12d, synchronized with each other by means of an electronic line shaft 14.

The electronic line shaft 14 includes a master controller 16 associated with and possibly controlling a motor 18a connected to the cylinder pair 12a. The master controller 16 receives a command signal 20 and a feedback signal 22a, the latter being either position or position and velocity, to provide the necessary position control of the cylinder pair 12a. The feedback signal 22a is typically provided by a position encoder 24a. Command signal 20 may be a digital word representing incremental encoder position or the like or other feedback devices providing for a position output. The command signal 20 may be derived from a circuit providing a virtual encoder output simulating a reference rotating shaft or from an actual reference encoder attached to a shaft that is minimally disturbed, such as a shaft on a high kinetic energy cylinder 12.

The master controller 16 communicates with a synchronization network 26 joining the master controller 16 and each of the servant motor drives 17a-17c.

The servant motor drives 17a-17c each receive a respective feedback signal 22b-22d from corresponding encoders 24b-24d. Each servant motor drives 17a-17c is associated with and controls one of motors 18b-18d joined respectively to one of cylinder pairs 12a-12d. Generally, the master controller 16 communicates with the servant motor drives 17a-17b to control motors 18b-18d so that cylinder pairs 12a-12d act as if they were connected by a mechanical line shaft and/or one or more gear boxes.

Figure 2:
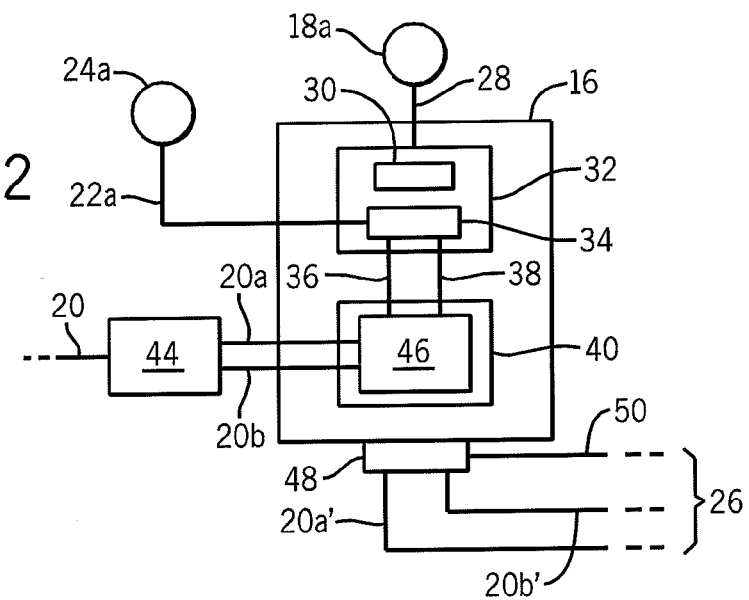
FIG. 2 is an expanded fragmentary view of the master controller incorporating a standard motor drive together with the predictor of the present invention and a network interface used to create signals for the servant drives.

Referring now to FIG. 2, the master controller 16 produces motor drive signals 28 that are received by the motor 18a being, for example, synthesized three-phase sine waves for a three phase motor 18a. Typically, the motor drive signals 28 are produced by a pulse width modulator 30 being part of standard motor drive 32. As is understood in the art, a feedback controller 34 within the motor drive 32 receives the feedback signal 22a and also receives a position input 36 and/or a velocity input 38 from a synchronization unit 40 as will be described. The feedback controller 34 computes an error signal used to drive the pulse width modulator 30 and may provide for sophisticated control strategies including inertia adaptation and velocity regulation employing both feedback and feed forward loops of types generally know in the art.

The synchronization unit 40 extracts the position input 36 and velocity input 38 from a command signal 20, which defines the operating speed and position of the line shaft. The command signal 20 may be broken into a position command signal 20a and a velocity command signal 20b according to techniques well known in the art, or alternatively separate position command signal 20a and a velocity command signal 20b may be measured from another line shaft using an encoder and tachometer.

As will be described in more detail below, the synchronization unit 40 includes a predictor 46 that receives the position command signal 20a and the velocity command signal 20b at a predictor 46 to produce a predicted position signal 20a' and a predicted velocity command signal 20b' communicated on the network 26. Strobe pulses 50 are communicated along the network 26 and are integral to network hardware 48 of the network 26. Note that generally dedicated conductors are not required for each of the signals 20', 20b and 50'. Predictor 46 also provides a non-advance output of position and velocity to master drive 16 so that master drive provides actual position control in synchronization with encoder input 20.

Figure 3:
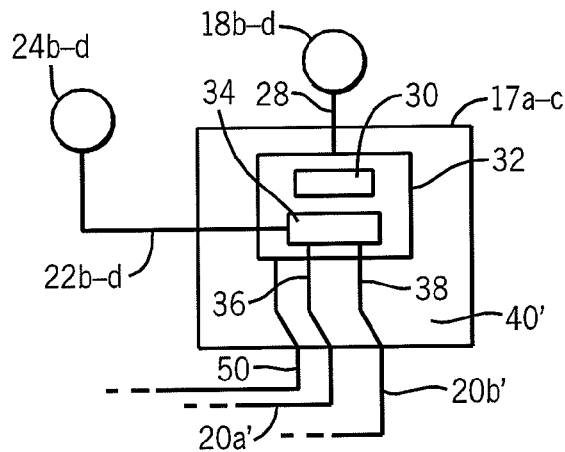
FIG. 3 is a figure similar to that of FIG. 2 of one of the servant drive systems showing the standard motor drive together with a network interface for receiving the signals from the master drive unit.

Referring now to FIG. 3, each of the servant motor drives 17a-17c also includes a motor drive 32, having a pulse width modulator 30 and feedback controller 34 receiving feedback signals 22b-d to produce motor drive signals 28 to motors 18b-d. As with the master controller 16, each motor drive 32 receives a position input 36 and velocity input 38. These inputs are attached directly to predicted position signal 20a' and predicted velocity signal 20b'. Drive 32 also receives synchronization strobe 50.

Figure 5:
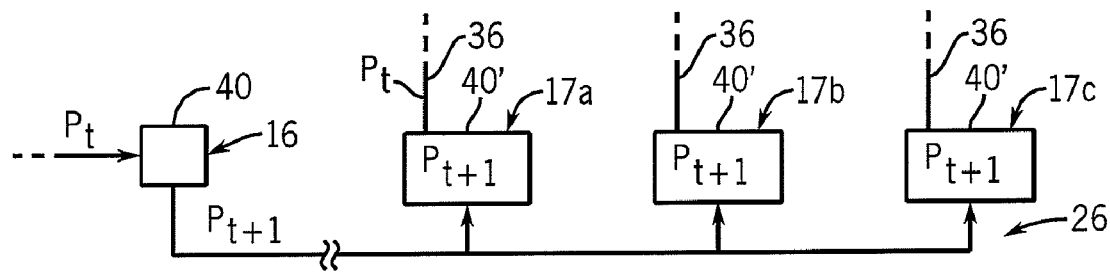
FIG. 5 is a signal flow diagram showing transmission of a predicted position signal from the master controller to the servant drives.

Referring now to FIG. 5, the synchronization unit 40 for the master controller 16 generally receives a command signal 20, for example a position signal $P_t$, representing a desired position of the printing press 10 at a given time t. The synchronization unit 40 then produces a predicted position signal $P_{(t+1)}$ representing a predicted value of the position signal at a future time (t+1) where 1 represents the time between strobe pulses 50. The predicted position signal $P_{(t+1)}$ is sent to each of the servant motor drives 17a-17c, where it is held.

Referring still to FIG. 5, the synchronization unit 40 for the master controller 16 also provides an actual position signal and actual velocity signal to the master drive 16 and both signals are delayed one sample interval from the predicted signals.

Figure 6:
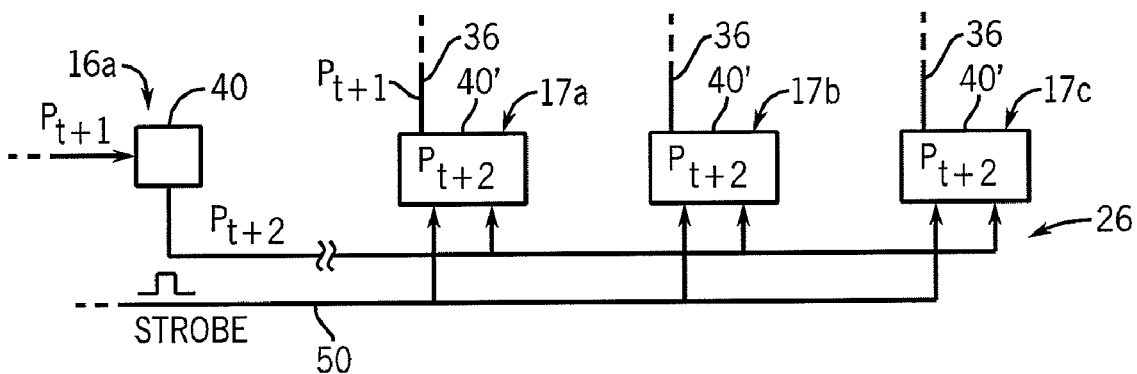
FIG. 6 is a figure similar to that of FIG. 5 showing a subsequent transmission of a strobe pulse that provides for current and synchronized position information to each of the servant drives.

Referring now to FIG. 6, at a later time (t+1), a strobe pulse 50 is delivered from the synchronization unit 40 of the master controller 16 to each of the synchronization units 40' of the servant motor drives 17a-17c together with a new predicted position signal $P_{(t+2)}$, representing a predicted value of the position signal at the time of the next strobe pulse 50 (e.g., time (t+2)).

Unlike the predicted position value, the strobe pulse 50 at time t+1 is delivered by a network mechanism providing for essentially no lag, and thus when the strobe pulse 50 is received at each of the servant motor drives 17a-17c, each of the drives converts the previously held predicted position signal $P_{(t+1)}$ into the current position input 36 and velocity input 38. The master drive 10 simultaneously receives the non-predicted position signal and thus the master drive and servant drives respond in synchronization to identical commands. As will be understood, the result of this process is to effect near simultaneous transmission of the position signal, despite network delay, to the limits of the ability to predict the position signal.

A similar system may be used for transmitting velocities signal $V_t$ and is not shown for clarity.

Figure 4:
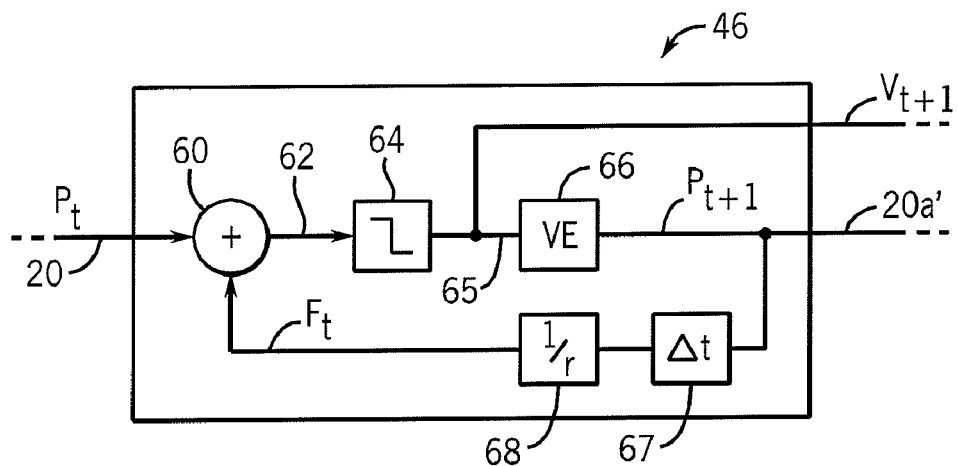
FIG. 4 is a simplified representation of the phase lock loop suitable for use as the predictor in FIG. 2.

Referring now to FIG. 4, predictor 46 is, in a preferred embodiment, a phase lock loop providing not only prediction and non-prediction signal of the position signal but also desirable filtering of the position signal. The phase lock loop receives the position signal $P_t$ (for example, represented as an encoder signal having a given frequency) at a phase comparator 60, producing a phase error signal 62 proportional to a difference between the phase of the signal $P_t$ and a feedback signal $F_t$, the latter to be described.

The phase error signal 62 may be filtered by a low-pass filter compensator 64 and then provided as a control signal 65 input to a virtual encoder 66 operating at a speed that is proportional to the control signal 65.

The output of the virtual encoder 66 is position fed back to the phase comparator 60 through a time delay block 67 and a multiplier/divider 68 to create the feedback signal $F_t$. As will be understood to those of ordinary skill in the art, a feedback loop is thereby created locking the phase of output of the virtual encoder 66 (as modified by the time delay block 67 and a multiplier/divider 68) to the phase of position command signal 20. As the phase starts to lag, the error produced by the phase comparator 60 rises, increasing the frequency of the virtual encoder 66 to correct that phase error, and conversely, when the phase of $F_t$ begins to lead, the error produced by the phase comparator 60 is reduced to lower the velocity input of the virtual encoder 66, thus correcting the phase again.

The time delay 67 in the feedback loop effectively advances the time of output of the virtual encoder 66 with respect to signal 20, and in the preferred embodiment is set to the interval of the strobe pulse 50. In this way, the output of the virtual encoder 66 provides the predicted position signal 20a'. Similarly, in this way, the control signal 65 to the virtual encoder 66 provides a predicted velocity signal 20b'. The predictor 46 also produces a current position signal 20a and a current velocity signals 20b to the master drive 16 that is not depicted in this diagram but is described below.

The multiplier/divider 68 may, for example, divide the frequency of the position signal 20 before it is received at the phase comparator 60 as feed signal $F_t$, resulting in a multiplication of the predicted position signal 20a' and predicted velocity signal 20b' to effect a virtual gear box causing later servant units 17a-17d to be driven at a higher speed. Conversely, or in addition, the multiplier/divider 68 may multiply the frequency of position signal 20 to provide for a higher frequency feedback signal $F_t$, effectively lowering the frequency of predicted position signal 20a' with respect to position signal 20, while maintaining phase lock causing later servant units 17a-17d to be driven at a lower speed. With both multiplication and division, an arbitrary gear ratio may be produced. Each of these operations is straightforward in a software implementation.

Figure 7:
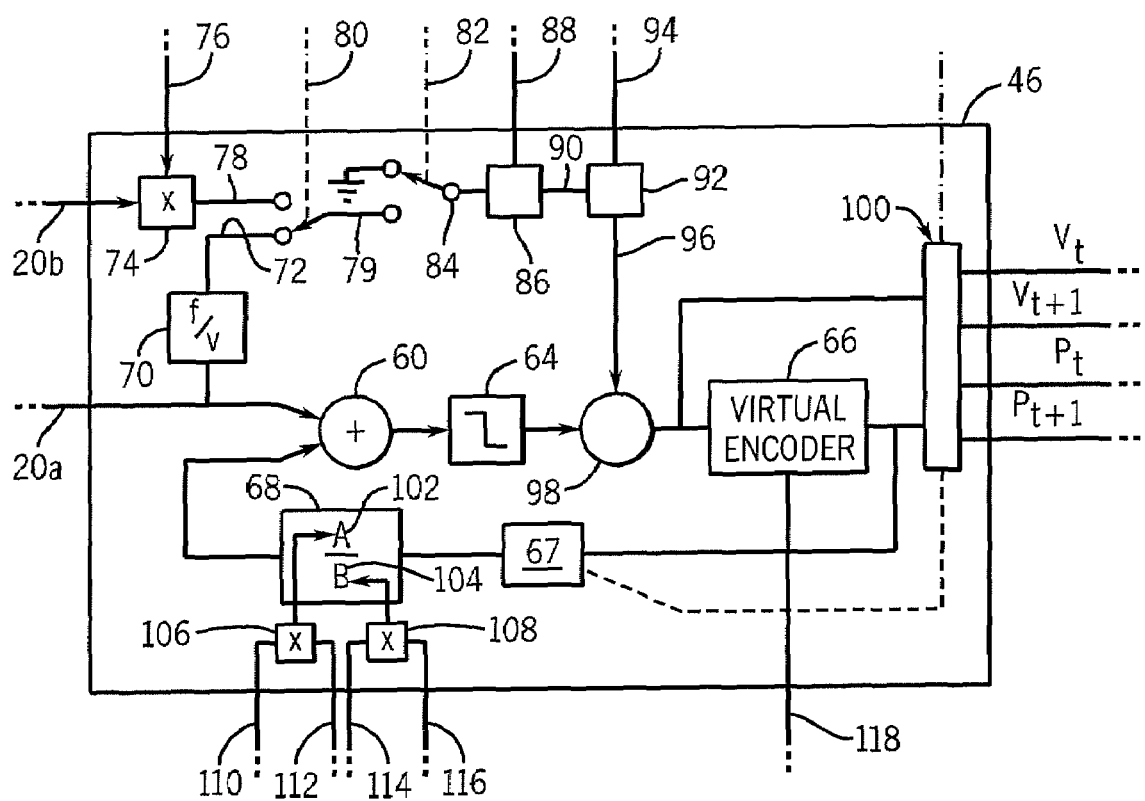
FIG. 7 is a detailed flow chart showing an implementation of the phase lock loop of FIG. 4 per the preferred embodiment of the present invention.

Referring now to FIG. 7, in the preferred embodiment the predictor 46 is implemented in software, for example in a digital signal processor (DSP), through a discrete emulation of classical phase lock loop components. This implementation allows a number of user-adjustments that may be programmed into the predictor 46.

Generally then predictor 46 receives a position command signal 20a and a velocity command signal 20b and the position signal, as described above, represented as an accumulation of pulses as from a of a binary pulse train. The position command signal 20a is provided to a phase comparator 60, whose output is connected to a low pass filter compensator 64, functioning generally as has been described above. The position command signal 20a may also be provided to a conversion block 70 to produce a velocity signal 72 in cases where there is no external velocity command signal 20b or in cases where it is not desired to use an external velocity command signal 20b.

The external velocity command signal 20b is received by a multiplier 74 which allows it to be scaled by an externally input scaling factor 76 to produce a scaled velocity signal 78. A selection between the derived velocity signal 72 and the scaled velocity signal 78 may be made by a user input 80 controlling a software implemented switch 79.

The output of switch 79 is received by a switch 84 accepting a user input 82 to either disable all velocity signals or accept the output from the switch 79.

The output from switch 84 may be received by an acceleration compensation block 86, which effectively takes the derivative of the velocity to produce a jerk signal, controllable by user input 88.

The jerk signal 90 is provided to a filter 92, controllable by user input 94 which provides a feedforward signal 96 for acceleration compensation which can help provide improved accuracy during conditions of acceleration change perk). The feed-forward signal 96 produced by the filter 92 is provided to a summing block 98 which sums it to the velocity signal received from filter compensator 64. The output of the summing block 98 provides the input to the virtual encoder 66.

Generally the velocity control described above provides for feed forward that can improve tracking at high rates of change and acceleration.

This input to the virtual encoder 66 may be routed through output buffer 100, which provides both current velocity and predicted velocity 20b' signals (the current velocity and current position are extracted in the underlying program by capturing outputs from a previous cycle of execution of the instructions)

A user input providing a scaling of the virtual encoder 66 is provided at 118, the input determining the virtual encoder 66 velocity corresponding to input change of position.

The output of the virtual encoder 66 is routed to output buffer 100, which provides both current position and predicted position signal 20a' Again, the servant drives receive the predicted position and the master drive the non-predicted position.

The output of the time delay block 67, as described above, is provided to the multiplier/divider 68 which allows for the input by the user of a numerator 102 or denominator 104 each derived from multiplier 106 or multiplier 108, respectively. Multiplier 106 may receive a gear box revolutions input 110 and an edges per revolution input 112, whereas multiplier 108 may receive a gear box revolutions output 114 and edges per revolution 116, allowing for simple programming of a gear box ratio in the present system. All of these inputs are integers and should not be reduced in the fraction. Multiplier/divider 68 provides an effective electronic gear ratio, implementing virtually the same functions as provided by a gear box.

The phase lock loop so implemented provides a natural low pass filter by nature of its closed loop operation. Such a filter effects a trade off between encoder noise and high frequency response that can be set by controlling the various parameters.

It is specifically intended that the present invention not be limited to the embodiments and illustrations contained herein, but include modified forms of those embodiments including portions of the embodiments and combinations of elements of different embodiments as come within the scope of the following claims.

We claim:

1. An electronic line shaft systems comprising:
   multiple servant motor drives receiving a position signal and a strobe signal and connectable to corresponding motor-driven line shafts to synchronize a position of the line shafts to the position signal at a time of the strobe signal;
   a master controller receiving a position signal from an encoder indicating the position of a master line shaft;
   a network communicating between the multiple servant motor drives and the master motor drive, the network having a communication delay;
   a synchronizing system including a predictor accepting the position signal from the master controller and providing a predicted position signal to the servant motor drives together with a strobe signal, the predicted position signal representing a prediction of a future position of the motor at a predetermined time in the future coinciding with a time of the strobe signal;
   whereby the communication delay may be corrected.

2. The electronic line shaft of claim 1 wherein the predictor is a phase locked loop including:

(i) an electronically controllable virtual encoder outputting a predicted position signal according to a frequency input, and
   (ii) a phase comparator receiving the predicted position signal and the position signal to produce a phase difference signal providing the frequency input to the electronically controllable virtual encoder.

3. The electronic line shaft of claim 2 wherein the predictor is implemented in at least one of the group consisting of analog electronic circuitry and digital electronic circuitry including a programmed electronic processor.

4. The electronic line shaft of claim 2 wherein the position signal is a periodic signal indicating change and direction of movement in movement increments.

5. The electronic line shaft of claim 2 wherein the predictor includes a divider/multiplier changing the frequency of one of the position signal and predicted position signal to change a ratio between the position signal and the predicted position signal while maintaining a phase lock between the position signal and the predicted position signal.

6. The electronic line shaft of claim 2 wherein the predictor includes a compensator positioned between the phase difference signal and the frequency input to provide a frequency filtering.

7. The electronic line shaft of claim 6 wherein the compensator provides a low pass filtering.

8. The electronic line shaft of claim 2 wherein the synchronizing system further transmits a velocity signal to the servant motor drives, the predictor providing the velocity signal from the frequency input to the electronically controlled virtual encoder.

9. The electronic line shaft of claim 2 including a time delay shifting one of the time of the position signal and predicted position signal to advance the phase of the predicted position signal while maintaining a phase lock between the position signal and the predicted position signal.

10. A master controller for an electronic line shaft system having multiple servant motor drives communicating with the master controller through a network having a communication delay, the servant drives receiving a position signal and a strobe signal and connectable to an electric motor to synchronize the motor to the position of the position signal at a time of the strobe signal, wherein the master controller comprises:
    a strobe generator periodically generating the strobe signal;
    a predictor accepting a position signal from an encoder and providing a predicted position signal, the predicted position signal representing a prediction of a future position of the motor at a predetermined time in the future coinciding with a time of the strobe signal;
    whereby the communication delay may be corrected.

11. The electronic line shaft of claim 10 wherein the predictor is a phase locked loop including:
    (i) an electronically controllable virtual encoder outputting a predicted position signal according to a frequency input, and
    (ii) a phase comparator receiving the predicted position signal and the position signal to produce a phase difference signal providing the frequency input to the electronically controllable virtual encoder.

12. The electronic line shaft of claim 10 wherein the predictor is implemented in at least one of the group consisting of analog electronic circuitry and digital electronic circuitry including a programmed electronic processor.

13. The electronic line shaft of claim 10 wherein the position signal is a periodic signal indicating change and direction of movement in movement increments.

14. The electronic line shaft of claim 11 wherein the predictor includes a divider/multiplier changing a frequency of one of the position signal and predicted position signal to change a ratio between the position signal and the predicted position signal while maintaining a phase lock between the position signal and the predicted position signal.

15. The electronic line shaft of claim 11 wherein the predictor includes a compensator positioned between a phase difference signal and the frequency input to provide a frequency filtering.

16. The electronic line shaft of claim 15 wherein the frequency filtering is a low pass filtering.

17. The electronic line shaft of claim 10 wherein the master controller further transmits a velocity signal to the servant motor drives, the predictor providing the velocity signal from the frequency input to the electronically controlled virtual encoder.

18. The electronic line shaft of claim 11 including a phase delay phase shifting the phase of the position signal and predicted position signal to advance the phase of the predicted position signal while maintaining a phase lock between the position signal and the predicted position signal.

19. An encoder signal conditioner comprising:
an encoder input for receiving a periodic position signal from an encoder;
a phase locked loop including:
(i) an electronically controllable virtual encoder outputting a conditioned encoder output according to a frequency input,
(ii) a phase comparator receiving the conditioned encoder output and the periodic position signal to produce a phase difference signal providing the frequency input to the electronically controllable virtual encoder; and
a position output for providing the condition encoder output to motor drives.

20. The encoder signal conditioner of claim 19 wherein the encoder signal is implemented in at least one of the group consisting of analog electronic circuitry and digital electronic circuitry including a programmed electronic processor.

21. The encoder signal conditioner of claim 19 wherein the position signal is a periodic signal indicating change and direction of movement in movement increments.

22. The encoder signal conditioner of claim 19 wherein the phase encoder includes a divider/multiplier changing the frequency of one of the position signal and conditioned encoder output to change a ratio between the position signal and the conditioned encoder output while maintaining a phase lock between the position signal and the conditioned encoder output.

23. The encoder signal conditioner of claim 19 wherein the phase encoder includes a compensator positioned between the phase difference signal and the frequency input to provide a frequency filtering.

24. The encoder signal conditioner of claim 23 wherein the frequency filtering is a low pass filtering.

25. The encoder signal conditioner of claim 19 further including a velocity output for providing a velocity signal from the frequency input to the electronically controlled virtual encoder.

26. The encoder signal conditioner of claim 19 further including a phase delay phase shifting the phase of the position signal and conditioned encoder output to advance the phase of the conditioned encoder output while maintaining a phase lock between the position signal and the conditioned encoder output.

27. The encoder signal conditioner of claim 26 further including multiple servant motor drives communicating with a master controller through a network having a communication delay, the servant drives receiving the conditioned position signal from the position output.

28. The encoder signal conditioner of claim 27 wherein the phase shift of the phase delay corresponds to the network delay.

29. The encoder signal conditioner of claim 28 greater than the network delay.

30. The encoder signal conditioner of claim 28 wherein each servant drive synchronizes a corresponding motor driven line shaft with the condition position signal at a time of a strobe signal.

31. The encoder signal conditioner of claim 30 further including a strobe generator periodically generating the strobe signal at a time when the conditioned position signal substantially equals the position signal.

* * * * *